United States Patent [19]
Dallabora et al.

[11] Patent Number: 5,717,636
[45] Date of Patent: Feb. 10, 1998

[54] EEPROM MEMORY WITH CONTACTLESS MEMORY CELLS

[75] Inventors: Marco Dallabora, Carpiano; Giovanni Campardo, Bergamo; Giuseppe Crisenza, Trezzo Sull' Adda, all of Italy

[73] Assignee: SGS-Thomson Microelectronics S.r.l., Agrate Brianza, Italy

[21] Appl. No.: 642,325

[22] Filed: May 3, 1996

[30] Foreign Application Priority Data

May 5, 1995 [EP] European Pat. Off. .............. 95830182

[51] Int. Cl.$^6$ ...................................................... G11C 16/00
[52] U.S. Cl. ....................... 365/185.13; 365/185.06; 365/185.11
[58] Field of Search ............................ 365/185.13, 185.03, 365/185.05, 185.11, 230.03, 185.06

[56] References Cited

U.S. PATENT DOCUMENTS

| | | | |
|---|---|---|---|
| 4,130,890 | 12/1978 | Adam | 365/184 |
| 5,117,269 | 5/1992 | Bellezza et al. | 357/23.5 |
| 5,245,570 | 9/1993 | Fazio et al. | 365/185 |
| 5,392,252 | 2/1995 | Rimpo et al. | 365/230.02 |
| 5,570,319 | 10/1996 | Santoro et al. | 365/230.03 |

FOREIGN PATENT DOCUMENTS

| | | |
|---|---|---|
| 0 369 829 A2 | 5/1990 | European Pat. Off. . |
| 0 422 347 A3 | 4/1991 | European Pat. Off. . |
| 0 509 696 A2 | 10/1992 | European Pat. Off. . |
| 0 522 780 A2 | 1/1993 | European Pat. Off. . |
| 0 552 531 A1 | 7/1993 | European Pat. Off. . |
| WO 94/14196 | 6/1994 | WIPO . |

OTHER PUBLICATIONS

Eitan, Boaz et al., "Alternate Metal Virtual Ground (AMB)—A New Scaling Concept for Very High–Density EPROM's", *IEEE Electron Device Letters*, vol. 12, No. 8, Aug. 1991, pp. 450–452.

Kammerer, W. et al., "A New Virtual Ground Array Architecture for Very High Speed, High Density EPROMS", IEDM 1991, *Digest of Technical Papers*, Dec. 1991, pp. 83, 84.

*Primary Examiner*—Tan T. Nguyen
*Attorney, Agent, or Firm*—David V. Carlson; Bryan A. Santarelli; Seed and Berry LLP

[57] ABSTRACT

In a flash-EEPROM array, the cells in each row are grouped into pairs connected to the same diffused source line and to two different diffused bit lines, and the adjacent pairs of cells are spaced so that, in each row, only one cell is connected to a respective diffused bit line. The array presents global bit lines in the form of metal lines, and each connected to a plurality of diffused local bit lines, at least one for each sector. For each sector and each global bit line, there are provided two diffused local bit lines connected to the same respective global bit line by selection transistors so that only one local bit line is biased each time.

39 Claims, 11 Drawing Sheets

Fig. 12

| | GW0 GW2 | GW1 | SW | GB0 | GB1 | SO | SE | RB | BS | W1 | W0 W2 | LB0a | LB0b LB1b | LB1a | CS | SB |
|---|---|---|---|---|---|---|---|---|---|---|---|---|---|---|---|---|
| R | 0 | 5 | -2 | 2 | 0 | 5 | 0 | 0 | -2 | 5 | 0 | 2 | F1 | 0 | 0 | 0 |
| W | 0 | -8 | -12 | 5 | 0 | 8 | 0 | 0 | -2 | -8 | 0 | 5 | F1 | 0 | 0 | 0 |
| E | 8 | 8 | 0 | 0 | 0 | 0 | 0 | -8 | -12 | 8 | 8 | F1 | F1 | F1 | 0 | -8 |

Fig. 13

| | GW0 GW2 | GW1 | SW | GB0 | GB1 | SO | SE | GS | SC | W1 | W0 W2 | LB0a | LB0b LB1b | LB1a | LS |
|---|---|---|---|---|---|---|---|---|---|---|---|---|---|---|---|
| R | 0 | 5 | -2 | 2 | 0 | 5 | 0 | 0 | -2 | 5 | 0 | 2 | F1 | 0 | -2 |
| W | 0 | -8 | -12 | 5 | 0 | 8 | 0 | 0 | -2 | -8 | 0 | 5 | F1 | 0 | -2 |
| E | 8 | 8 | 0 | 0 | 0 | -8 | -8 | -8 | -12 | 8 | 8 | F1 | F1 | F1 | -8 |

Fig. 14

|   | GW0/GW2 | GW1 | SW  | GB0 | GB1 | SO | SE | W1 | W0/W2 | LB0a | LB0b/LB1b | LB1a | CS |
|---|---------|-----|-----|-----|-----|----|----|----|-------|------|-----------|------|----|
| R | 0       | 5   | -2  | 2   | 0   | 5  | 0  | 5  | 0     | 2    | F1        | 0    | 0  |
| W | 0       | 12  | -2  | 5   | 0   | 8  | 0  | 12 | 0     | 5    | F1        | 0    | 0  |
| E | -8      | -8  | -12 | 5   | 5   | 8  | 8  | -8 | -8    | 5    | 5         | 5    | 0  |

Fig. 15

|   | GW0/GW2 | GW1 | SW  | GB0 | GB1 | SO | SE | GS | SC | W1 | W0/W2 | LB0a | LB0b/LB1b | LB1a | LS |
|---|---------|-----|-----|-----|-----|----|----|----|----|----|-------|------|-----------|------|----|
| R | 0       | 5   | -2  | 0   | F1  | 5  | 0  | 2  | -2 | 5  | 0     | 0    | F1        | F1   | 2  |
| W | 0       | 12  | -2  | 5   | 0   | 8  | 0  | 0  | -2 | 12 | 0     | 5    | F1        | 0    | 0  |
| E | -8      | -8  | -12 | 5   | 5   | 8  | 8  | 0  | -2 | -8 | -8    | 5    | 5         | 5    | 0  |

EEPROM MEMORY WITH CONTACTLESS MEMORY CELLS

TECHNICAL FIELD

The present invention relates to a flash-EEPROM memory comprising a memory array with contactless memory cells.

BACKGROUND OF THE INVENTION

As is known, computer systems, from personal to mainframe types, present different ground memory requirements depending on the type of computer involved, and which are normally classed according to the performance level required. More specifically, the higher levels are characterized by high performance and cost, and the lower levels by low performance and cost. Palm and laptop computers also present additional requirements, such as compactness, low consumption and plugability, and a strong demand is now felt for interchangeable systems using a PC board interface standard.

At present, flash-EEPROMs are highly favored for producing computer system mass memories, for which application, the following characteristics are demanded:

very high density (the most advanced disks present a density of over 200 Mbit/sq. in);

high performance (search time ≈10 milliseconds (ms), waiting time ≈5 ms, data speed <5 MB/s, corresponding to less than 0.8 s to transfer a sector of 512 B); and low cost per megabyte.

Various flash-EEPROM architectural and structural solutions have therefore been proposed to meet the above requirements.

One of these is discussed in the article entitled "A New Virtual Ground Array Architecture for Very High Speed, High Density EPROMs" by W. Kammerer, B. Sani, P. Kauk, R. Kazerounian, B. Eitan, IEDM 1991, *Digest of Technical Papers*, Dec. 1991, p. 83, 84; and another in the article entitled "Alternate Metal Virtual Ground (AMG)—A New Scaling Concept for Very High Density EPROMs" by Boaz Eitan, R. Kazerounian, A. Bergemont, *IEEE Electron Device Letters* 12 (8): 450–452, August 1991. Both these solutions are characterized by a virtual ground architecture featuring so-called contactless cells, in which the bit lines diffused in the substrate and extending perpendicular to the word lines are also used for forming virtual source lines alternating with diffused bit lines used as drain lines.

The difference between conventional and contactless memory cells is shown in FIGS. 1a and 1b. FIG. 1a shows a portion of a conventional memory array forming a number of cells 1, wherein the common source lines, in the form of lines 2 diffused in the substrate 3, extend perpendicular to the bit lines 4 which are in the form of metal lines over (and electrically insulated from) substrate 3. Contacts 5 electrically connect bit lines 4 to drain regions 6 diffused in substrate 3 and separated from source lines 2 by channel regions 7 formed by substrate 3 itself (bulk regions). Word lines 8, in the form of lines of semiconductor material at a lower level than (and electrically insulated from) bit lines 4, extend parallel to common source lines 2 and over the channel regions 7 of cells in the same row. Source lines 2 form the source region S of cell 1, regions 6 the drain region D, and word lines 8 the control gate region G. FIG. 1a does not show the floating gate regions located between and electrically insulated from channel regions 7 and control gate regions G, for storing the electrical charge determining the "written" or "erased" condition of the cell in known manner.

FIG. 1b shows a memory array with contactless cells and a virtual ground structure, and comprising a number of cells 10, each formed between two bit lines 11 and 12 diffused in a substrate 13 and extending parallel to each other and perpendicular to the word lines 14 which comprise lines of semiconductor material extending over and insulated from substrate 13. Bit lines 11 and 12 present contacts 15 with metal lines (not shown), so as to be appropriately biased and define drain and source regions D and S. The channel region 16 is formed in this case between the two bit lines 11, 12, and beneath word lines 14 which in mm form the control gate regions G over channel regions 16. Again, the floating gate regions are not shown.

The contactless memory cell structure is claimed, for example, in U.S. Pat. No. 5,117,269 granted to the present Applicant on May 26, 1992 (inventors: Bellezza, Melanotte).

In the first article by Kammerer et at. mentioned above, the diffused bit lines are segmented, and control transistors are provided between the metal (bit and source) lines and each diffused line segment (instead of contacts 15) to supply only the segment relative to the cells for reading or writing, and so reduce the line capacity. In the second article by Eitan et al., the segmented diffused lines alternate with continuous diffused lines, and control transistors are provided to connect each segmented diffused line (which operates as a source line) to one or the other continuous diffused line, which is supplied with source voltage, to read or write one of two adjacent cells in the same row.

While greatly improving performance of the memory array in terms of speed and integration density, the above architectures fail to provide the flexibility necessary to meet the differing requirements mentioned above in terms of performance (and cost), and so enable all-round use on any type of computer. More specifically, the above architectures require the use of all three terminals (drain, source, gate) to write the cells by channel hot electron injection (CHE write) for decoupling adjacent cell pairs, but do not allow for writing the cells by Fowler-Nordheim tunneling, which only permits the use of two terminals, the third being left floating.

More specifically, with CHE writing, a medium-high voltage is applied between the drain and source regions in the presence of a high control gate voltage. In this situation, current is generated between the drain and source regions. The electrons of the current are accelerated by the existing transverse electric field, and some of the more energetic electrons succeed in overcoming the barrier between the substrate and floating gate region, formed by the tunnel oxide layer over the channel region, and in reaching the floating gate region to write the cell. By requiring the biasing of all three terminals of the cell, CHE writing provides for decoupling adjacent cells in the same row (which present only two terminals in common), and is therefore suited to the virtual ground structure shown in FIG. 1b.

Conversely, Fowler-Nordheim tunneling consists in applying a high voltage between the control gate region and, normally, the source (or channel) region, to achieve a high electric field, and hence current, between the floating gate region and the source (or channel) region, and so extract or trap electrons in the floating gate region. The third terminal (normally the drain) is left floating. Fowler-Nordheim tunneling (hereinafter referred to as FN tunneling), however, cannot be applied for writing contactless cells with the virtual ground architecture shown in FIG. 1b, since it would result in similar biasing of two adjacent cells in the same row, with their drain terminals connected to the same bit line, and their gate regions formed by the same word line 14

(cells $10_2$ and $10_3$), on account of all the source terminals being connected to one another. (Erasure, on the other hand, may be performed by FN tunneling, by virtue of it being performed simultaneously for all the cells in each sector.)

SUMMARY OF THE INVENTION

A need is felt for a more flexible solution permitting contactless cells to be written using two or three terminals, depending on the application.

Therefore, it is an object of the present invention to provide a flash-EEPROM memory which is compact, as in the case of contactless cells, presents a high degree of flexibility, permits writing of the cells using two or three terminals indifferently, as required, and also presents a high degree of flexibility as regards other technological parameters and processes, for enabling it to be used as a ground memory in computers of various types.

In practice, according to the invention, the cells in each row are grouped into pairs connected to the same diffused source line and to two different diffused bit lines, and the adjacent pairs of cells are spaced so that, in each row, only one cell is connected to a respective diffused bit line. The array presents global bit lines in the form of metal lines, and each connected to a number of diffused local bit lines, at least one for each sector. For each sector and each global bit line, provision is advantageously made for two diffused local bit lines connected to the same respective global bit line via selection transistors, so that only half the local bit lines connected to an addressed bit line, or even only one local bit line, is biased each time.

The above architecture thus provides for achieving a modular structure compatible with the requirements of solid state disks and with EPROM substitution specifications, by permitting the size of the sectors to be varied from 512 Bytes to over 16 Kbytes, by permitting the programming procedure to be selected as required (full FN mode for write and erase, or FN mode for erase and CHE mode for write),and by virtue of the high data throughput speed. Moreover, the structure according to the present invention presents no stress or noise in the unused sectors in any operating condition (erase/write/read).

BRIEF DESCRIPTION OF THE DRAWINGS

A number of preferred, non-limiting embodiments of the present invention will be described by way of example with reference to the accompanying drawings, in which:

FIGS. 12 to 15 show biasing diagrams of the solutions in FIGS. 9 to 11.

DETAILED DESCRIPTION OF THE INVENTION

Figure 1A:
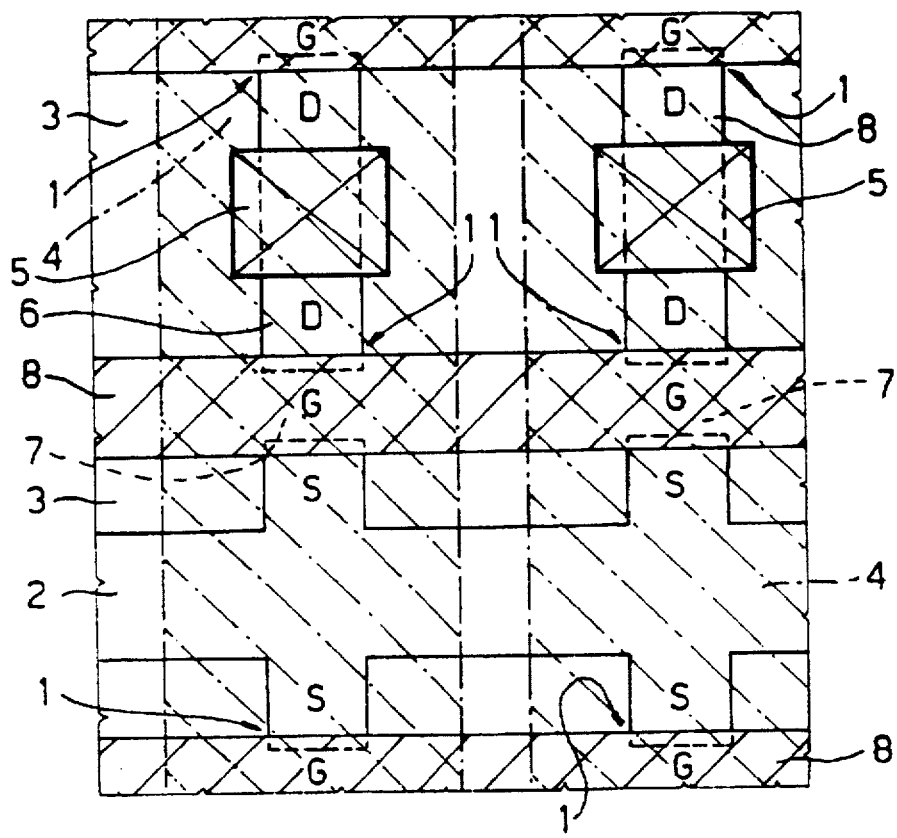
FIGS. 1a and 1b show two different structures of known cells.
Figure 1B:
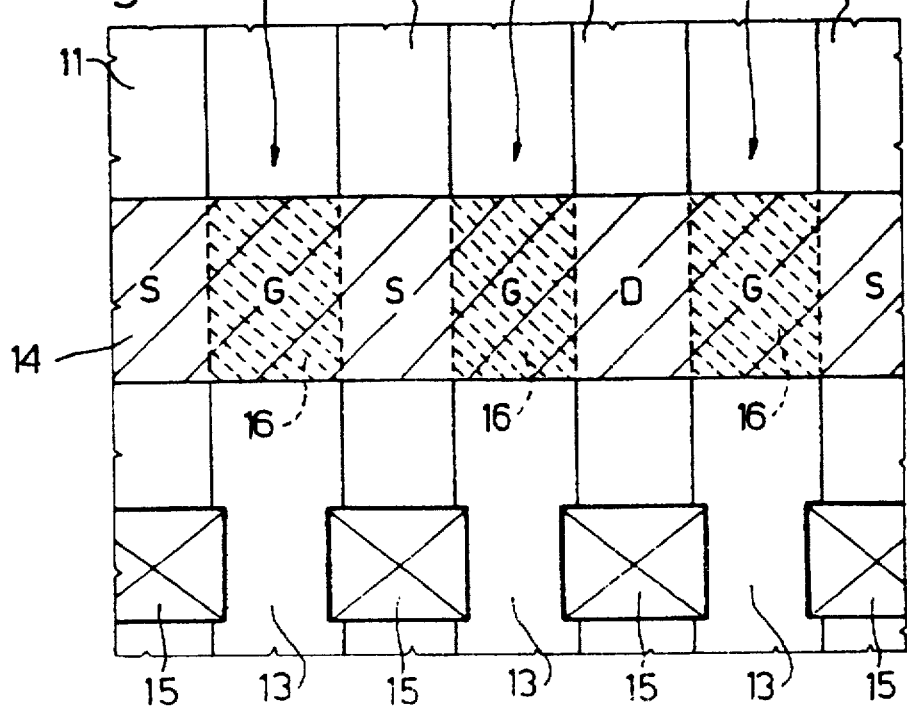
Figure 2:
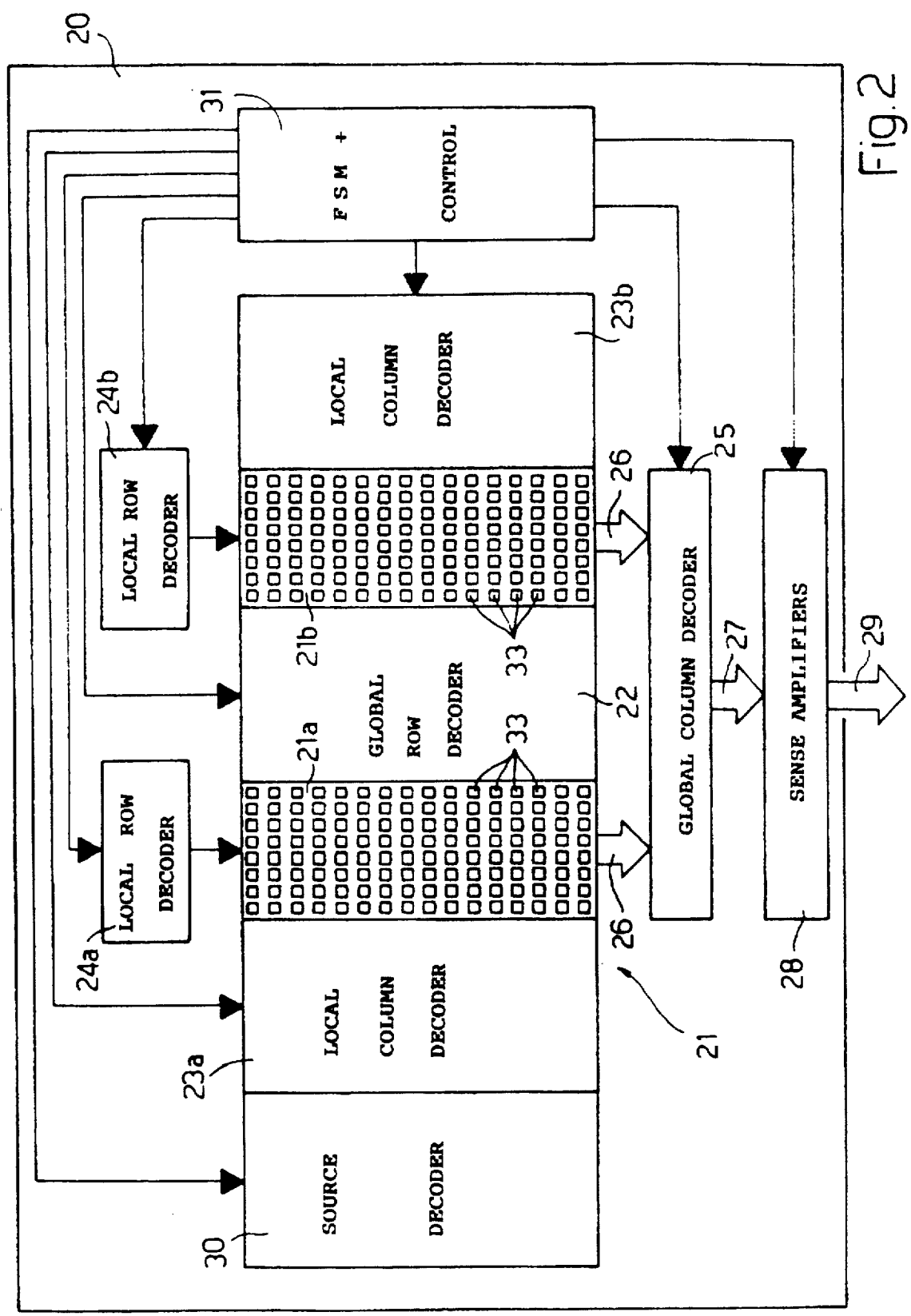
FIG. 2 shows the overall architecture of the memory according to the invention.
Figure 3:
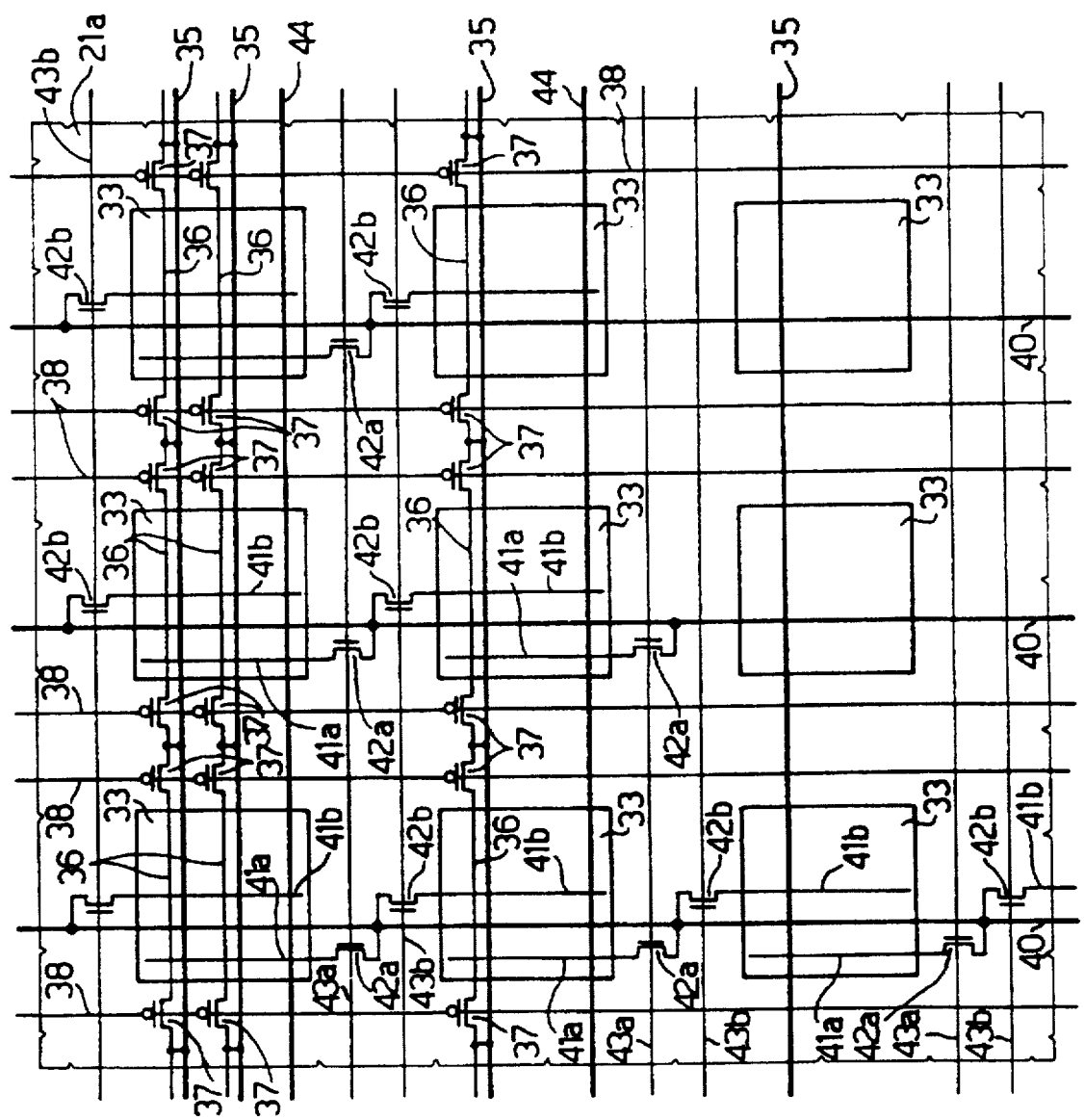
FIG. 3 shows an enlarged detail of the FIG. 2 architecture.
Figure 4:
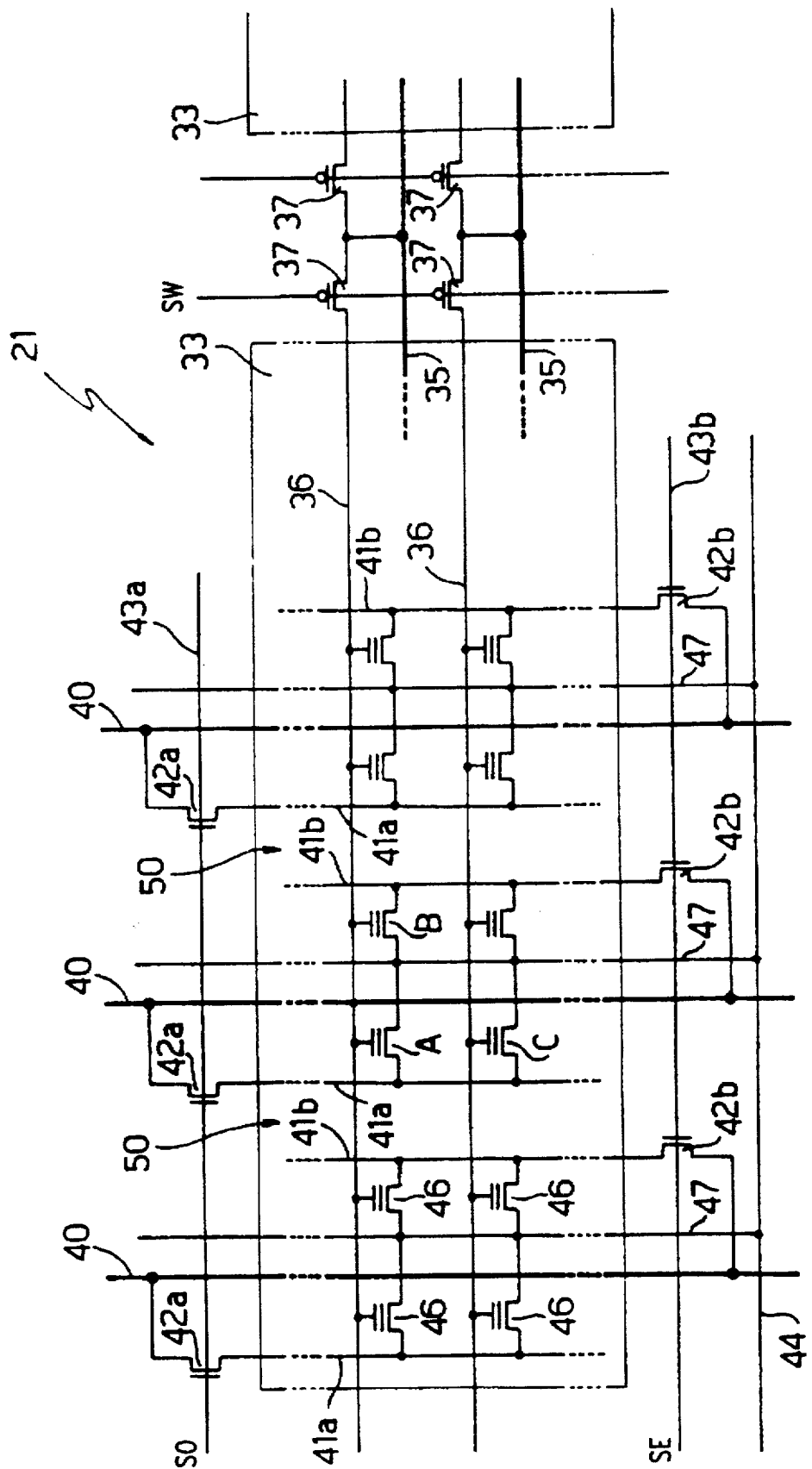
FIG. 4 shows the schematic diagram of a detail in FIG. 3.

FIGS. 2 to 4 show one embodiment of a memory 20 in accordance with the present invention, comprising a 1 Mbit memory array 21 comprising 16×16 sectors of 512 Bytes, with 32 rows and 128 columns of cells per sector. In array 21, the bit lines and word lines are divided into global lines common to all the sectors in the same column or row, and into local lines, each relative to its own sector. The global elements are decoded globally to bias only the sector/s to be read, written or erased. More specifically, the global bit lines are formed in a second (upper) metal level, the local bit lines are in the form of active area $N^+$diffused lines, the global word lines are formed in a first (lower) metal level, and the local word lines are formed in a second-level polysilicon layer (the first, lower, level is used for forming the floating gates).

Global column decoding is divided into sixteen blocks of 64 global bit lines, each global bit line being connected to two local bit lines relative to the same sector, and only one of the sixteen blocks is active each time. When the array is organized in eight outputs, eight global bit lines per sector are decoded and connected to the sense amplifiers. The 64 global bit lines in the 128 local bit lines per sector are decoded by means of local bit selection transistors preferably located on either side of the sector to relax the limits imposed by the layout rules. The pairs of local bit selection transistors relative to sectors in the same row are controlled by two local bit selection lines formed in the first metal level.

Row decoding is performed by means of local word selection transistors connecting the global word lines to the local word lines. The local word selection transistors relative to the same sector column are controlled by the same local word selection line formed in the second polysilicon level. Depending on whether the cells are formed in twin or triple wells (as described in more detail later on), the local word selection transistors may be P-channel only or also N-channel. Depending on the layout rules and the efficiency of the array, the local word selection transistors may also be located on either side of each sector.

Source biasing is performed either by means of a common source line in the form of a first-level metal line common to all the sectors in the same row, or by means of a decoder selectively biasing one or more sectors in the same row.

According to one aspect of the present invention, the bulk of the cells in one sector may be biased independently of the substrate, in particular for FN erasing the cells in one sector, in which case, a separate bulk decoder is preferably provided for all the sectors in one row.

FIG. 2 shows the resulting overall architecture. Memory array 21 is divided vertically into two identical half arrays 21a, 21b separated by a global row decoder 22. Respective local column decoders 23a and 23b are provided on the outer sides of half arrays 21a and 21b. Respective local row decoders 24a and 24b are provided over half arrays 21a and 21b. Below the two half arrays 21, there is provided a single global column decoder 25 connected to the half arrays by the global bit lines not shown in detail in FIG. 2 and indicated schematically by arrows 26. The outputs of global column decoder 25 (indicated schematically by arrow 27) are connected in known manner to a sense amplifying unit 28, the outputs of which (arrow 29) present the data read in memory array 21.

A local source decoder 30 is provided to the side of local column decoder 23a, p for decoding all the sectors in one row, or for dedicated decoding of each sector. One section of the local source decoder may provide for biasing and controlling the bulk regions of sectors 33 in the same row, if bulk decoding is provided for, as explained in more detail later on with reference to FIG. 9.

FIG. 2 also indicates a block 31 incorporating, for example, finite state machine (FSM) functions for controlling the operation sequence and for overall control of units 22–25 and 28, to which block 31 is connected by selection lines. Selection and global word lines (not shown in FIG. 2) are also provided between units 22–24, as described in more detail with reference to FIGS. 3 and 4.

The small squares in FIG. 2 show the 16×32 sectors 33 of memory array 21.

FIG. 3 is an enlarged detail of FIG. 2, showing nine sectors 33 arranged in three rows and three columns, and global word lines 35 extending horizontally from global row decoder 22 (FIG. 2) across the full width of half arrays 21a and 21b, and connected to local word lines 36 by P-channel local word selection transistors 37. In the example shown, a pair of local word selection transistors 37 is provided for each global word line and for each sector, and the two transistors 37 in each pair relative to the same sector 33 are located on either side of the sector. Local word selection transistors 37 are controlled by local word selection lines 38. More specifically, the transistors 37 relative to the same column of sectors 33 are controlled by the same local word selection line 38, and local word selection lines 38 are connected (not shown) to local row decoder 24a (FIG. 2).

Global bit lines 40 extend vertically from global decoder 25 over the full height of half arrays 21. Each global bit line 40 is connected to a pair of local bit lines 41a and 41b per sector 33 by respective N-channel local bit selection transistors 42a and 42b. The local bit selection transistors 42a relative to sectors 33 in the same row are controlled by the same local bit selection line 43a. The local bit selection transistors 42b relative to sectors 33 in the same row are controlled by the same local bit selection line 43b. Local bit selection lines 43a and 43b are connected to local column decoder 23a (FIG. 2), and the two transistors 42a and 42b relative to the same global bit line 40 and to the same sector 33 are located on either side of the sector.

FIG. 3 also shows global source lines 44 extending parallel to global word lines 35, and preferably in the form of first-level metal lines connected to source decoder 30.

FIG. 4 shows a detail of sector 33, of which are shown twelve cells 46 arranged in two rows and six columns, and connected to three global bit lines 40. Cells 46 present the drain terminal connected to a respective local bit line 41a or 41b, the source terminal connected to a respective source bit line 47, and the control gate terminal connected to a respective local word line 36. Source bit lines 47 are connected directly to global source line 44.

In practice, as shown in FIG. 4, the pair of cells in the same row and connected to the same global bit line 40 shares the same source bit line 47, and each local bit line is connected to only one column of cells, instead of two as in the known virtual ground architecture.

FIG. 4 also shows the signals SO and SE for respectively controlling local bit selection transistors 42a and 42b, and the signal SW for controlling local word selection transistors 37.

The cells and bit lines forming the local bit lines and source bit lines present a different arrangement as compared with the virtual ground arrangement described in the aforementioned articles. More specifically, the local bit lines and source bit lines do not alternate, and the cells do not follow one another regularly and equally spaced side by side. As shown in FIG. 4, the cells in each row of the sector are paired (e.g., cells A and B), each pair of cells is spaced laterally from the adjacent pairs, two local bit lines 41b and 41a extend side by side to bias two different pairs of cells, and the two side-by-side local bit lines 41b and 41a are separated physically and electrically by a space 50.

At the expense of a slight increase in the area occupied, the above arrangement provides for writing cells 46 indifferently using two or three terminals, depending on the application. To write cell A, for example, the gate and drain terminals of cell A are biased in response to the control signals SW and SO. The source terminal of cell A (and of all the other cells in the same sector) is left floating, and the adjacent cells undergo no stress and are in no danger of also being written. Cell B, in fact, adjacent to cell A and forming part of the same pair, will present a floating drain (and also source) terminal, by virtue of the local bit selection transistor 42b of the same pair being mined off (low signal SE), and cell C beneath cell A (and, in general, all the cells in the same column) will present a floating control gate terminal by virtue of being connecting to a different local word line 36.

Figure 5A:
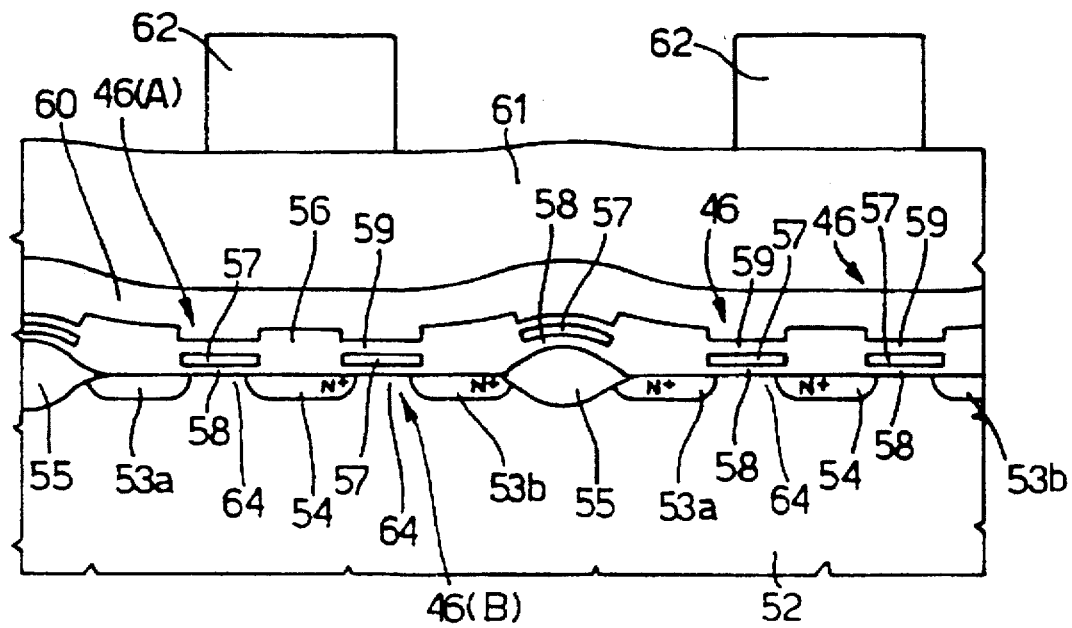
FIGS. 5a and 5b respectively show a cross section of a wafer of semiconductor material in which the cells of the memory according to the invention are formed, and the relative fabrication masks.

Implementation of the above arrangement of cells and local drain and source bit lines is shown in FIG. 5a, which shows a cross section along the word line of two pairs of cells 46.

More specifically, FIG. 5a shows a P-type substrate 52 on which are formed, roughly speaking, an insulating oxide layer 56, a number of strips of semiconductor material 60 (only one shown) forming the word lines (36 in FIG. 4), an interlayer insulating layer 61, and strips of conducting material 62 forming the global bit lines (40 in FIG. 4). The other connecting lines (even at higher levels than strips 62) and the passivation and finish layers are not shown.

$N^+$-type drain regions 53a and 53b and source regions 54 are formed in substrate 52 in the form of strips perpendicular to the FIG. 5a plane and therefore shown in section. Regions 53a, 53b, and 54 correspond to and are arranged in the same way as lines 41a, 41b, and 47 in FIG. 4. Between two adjacent regions 53a and 53b of two different pairs of cells 46, there is provided a thick oxide region 55 corresponding to space 50 separating pairs of cells 46 in the direction of word lines 36 (strip 60). In a manner not shown, thick oxide region 55 also separates successive cells 46 in a direction perpendicular to word lines 36 (e.g., cells A and C in FIG. 4, in the direction of global bit lines 40).

Insulating layer 56 embedding floating gate regions 57 of semiconductor material, preferably polysilicon, comprises different oxide layers forming tunnel oxide regions 58 and interpoly oxide regions 59 in known manner and therefore not shown in detail. As shown in FIG. 5a, floating gate regions 57 are equally spaced in the direction of word line 36, and located at channel regions 64 between pairs of regions 53a and 54, and 54 and 53b, and at thick oxide regions 55.

Strips 60, preferably of polysilicon, are formed by different deposited layers, e.g., of tungsten silicide ($WSi_2$), whereas regions 62 comprise metal (e.g., aluminium) lines.

Figure 5B:
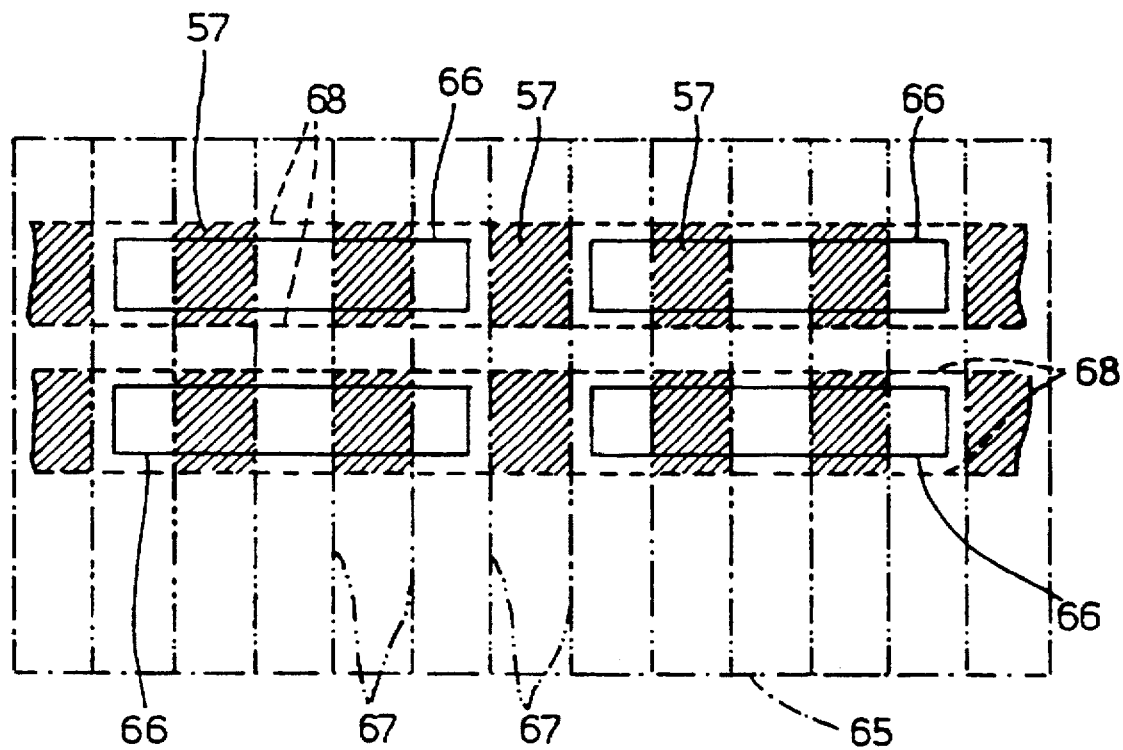

Fabrication of the memory cells of array 21 will now be described briefly with reference to FIG. 5b, which shows a portion of some of the masks employed.

To begin with, inside the region defined by an array mask 65 (dot and dash line), and after depositing a layer of oxide (100–200Å) and nitride (900–1500Å) on substrate 52, there is formed an active area mask 66 (thin continuous lines) comprising a number of rectangles in which to form pairs of cells 46 (e.g., cells A and B in FIG. 4), and each of which is separated from the adjacent rectangles (in the direction of word lines 36) by a space roughly equal to a channel length. In the region outside the rectangles, a thick oxide (field oxide) layer is then grown to insulate the pairs of cells (including regions 55 in FIG. 5a). A tunnel oxide layer (58 in FIG. 5a) is grown, and a polycrystalline silicon layer is deposited and patterned by means of a floating gate mask 67 (dash and two dot line) comprising a number of parallel strips perpendicular to the active area rectangles (lines 66), and which provides for forming the polysilicon strips with which floating gate regions 57 are to be formed.

After forming an oxide layer (interpoly oxide 59 in FIG. 5a) and possibly also a protective semiconductor layer, source and drain regions 53a and 53b are implanted using a mask complementary to floating gate mask 67 (and therefore comprising a number of strips exposing the surface between adjacent polysilicon strips) to reach the active area regions, and by selectively removing the layers over the substrate (protective semiconductor layer, interpoly oxide, tunnel oxide).

Oxide layer 56 is then re-formed over the implanted source and drain bit lines 53a and 53b, and a polycrystalline silicon layer is deposited and patterned using a word mask 68 (dash line) comprising a number of parallel strips placed over the active area rectangles (perpendicular to the strips of floating gate mask 67). Mask 68 therefore defines the word lines (60 in FIG. 5a) and, perpendicular to these, the floating gate regions (shown by the dash lines in FIG. 5b) which are automatically aligned with the word regions. This is then followed by formation of dielectric interlayer 61, the connecting lines (including metal lines 62), and the finish structures of the array (not shown).

Figure 6:
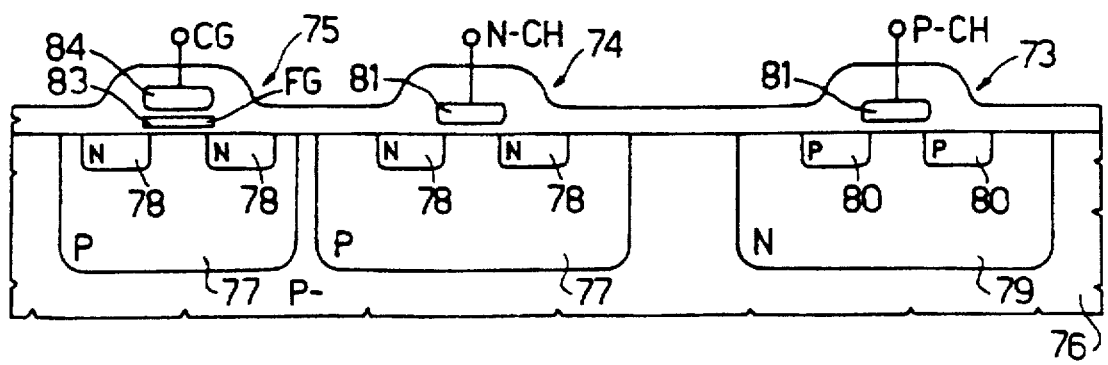
FIGS. 6 and 7 show cross sections, relative to two different solutions, of a wafer of semiconductor material, illustrating the arrangement of the semiconducting and insulating regions forming cells and transistors of the memory according to the invention.
Figure 7:
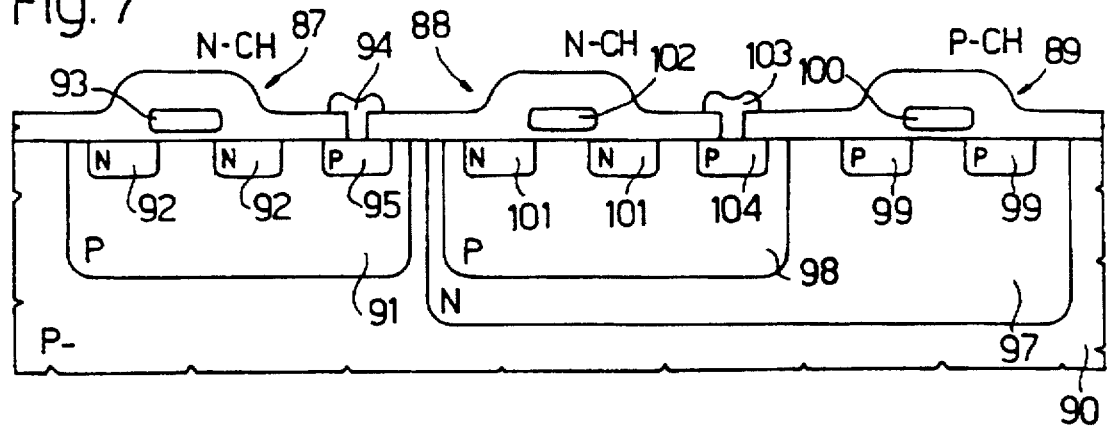

FIGS. 6 and 7 show two ways of integrating the FIG. 5a cells in a substrate of semiconductor material, depending on the availability of twin well or triple well technology.

FIG. 6 shows the integration of a P-channel transistor 73, an N-channel transistor 74, and a memory cell 75 in a P-type semiconductor substrate 76 using twin well technology. N-channel transistor 74 and cell 75 are housed in a respective P-well 77, and comprise N-type diffused source and drain regions 78. P-channel transistor 73 is housed in an N-well 79, and comprises N-type source and drain regions 80. The source and drain regions of components 73–75 need not necessarily be the same, as instead shown in FIG. 6, depending on the technology used. Transistors 73 and 74 present gate regions 81 embedded in an insulating layer 82, and cell 75 presents, as is known, a stacked-gate structure comprising a floating gate FG 83 and control gate CG 84 formed in two different polysilicon layers and embedded in insulating layer 82 (comprising different dielectric and oxide layers in a known manner).

FIG. 7 shows the integration of two N-channel transistors 87, 88, and a P-channel transistor 89 in a P-type substrate 90 using triple well technology. Being similar to that of transistor 88, integration of a memory cell is not shown. N-channel transistor 87 is similar to transistor 74 in FIG. 6, and as such is integrated in a P-well 91, and comprises source and drain regions 92, and a gate region 93. A contact 94 towards well 91 is also shown, which opens on to a P+-type enriched region 95 for biasing substrate 90. Transistors 88 and 89, on the other hand, are formed in an N-well 97, and more specifically, P-channel transistor 89 is formed directly in well 97, and N-channel transistor 88 in its own P-well inside well 97. Similarly, and as described in detail with reference to FIG. 8, the memory cells are formed in their own P-wells 98, one for each sector of the memory array.

Transistor 89 therefore comprises P-type source and drain regions 99 formed in well 97, and a gate region 100 above. Transistor 88 comprises N-type source and drain regions 101 formed in well 98, and a gate region 102 above. Here, too, a contact 103 towards well 98 is shown, which opens on to a P+-type enriched region 104, for independently biasing well 98 at a lower potential than substrate 90. This bias condition is made possible by the fact that, in such a situation, the parasitic diode formed between wells 97 and 98 is inversely biased and therefore definitely turned off.

Figure 8:
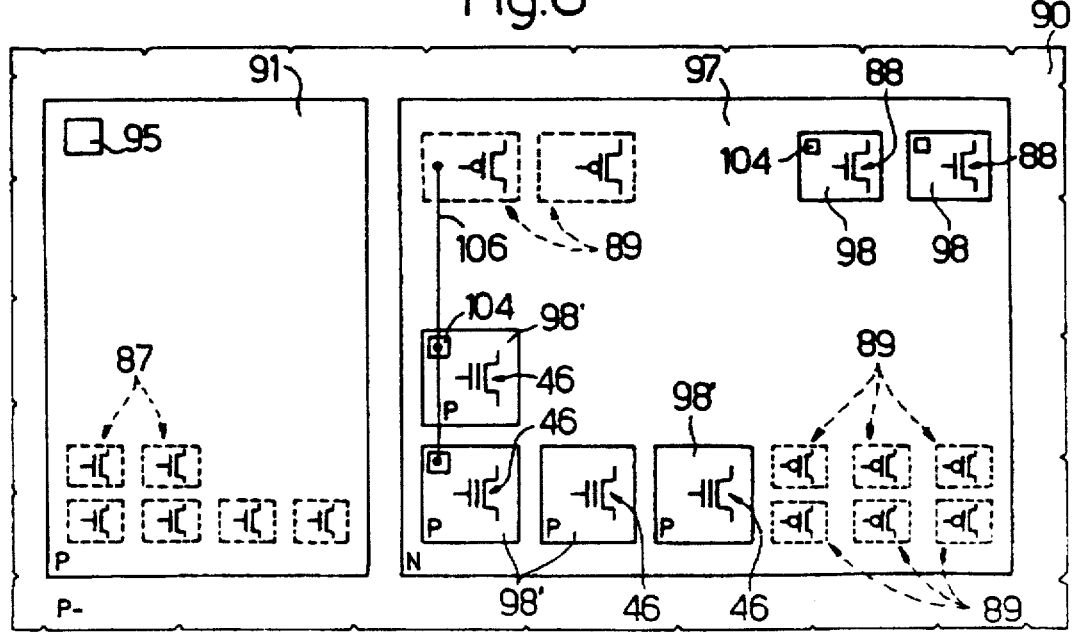
FIG. 8 shows a top plan view of the layout of the FIG. 7 solution.

FIG. 8 shows a schematic top plan view of a portion of memory 20 formed using the triple well technology in FIG. 7.

More specifically, FIG. 8 shows, schematically, P-well 91 and N-well 97, transistors 87 (dotted line) and region 95 (continuous line) inside well 91, wells 98 inside well 97 and housing transistors 88, wells 98 inside well 97 and housing sectors of the memory array, as shown schematically by cells 46, and P-channel transistors 89 (dotted lines), some of which are connected (line 106) to enriched regions 104, for biasing wells 98 as explained with reference to FIG. 9.

The FIG. 7 and 8 solution therefore provides for writing the memory cells by dividing the write voltage between control gate region CG and the substrate, i.e., for reducing the write voltage value to be applied to the control gate region, by simultaneously biasing the channel region at a negative value (e.g., −8 V). Conversely, the FIG. 6 solution does not permit the bulk region (well 77) to be negatively biased with respect to ground (i.e., to substrate 76) and therefore requires application of the full write voltage to control gate region 84.

The possibility of employing twin well (FIG. 6) or triple well (FIG. 7) technology, of selecting between FN tunneling or hot electron injection CHE write modes, and of employing a source and bulk (when possible) decoder, provides for achieving various memory array and bias circuit solutions, as described in detail below with reference to FIGS. 9 to 15.

Figure 9:
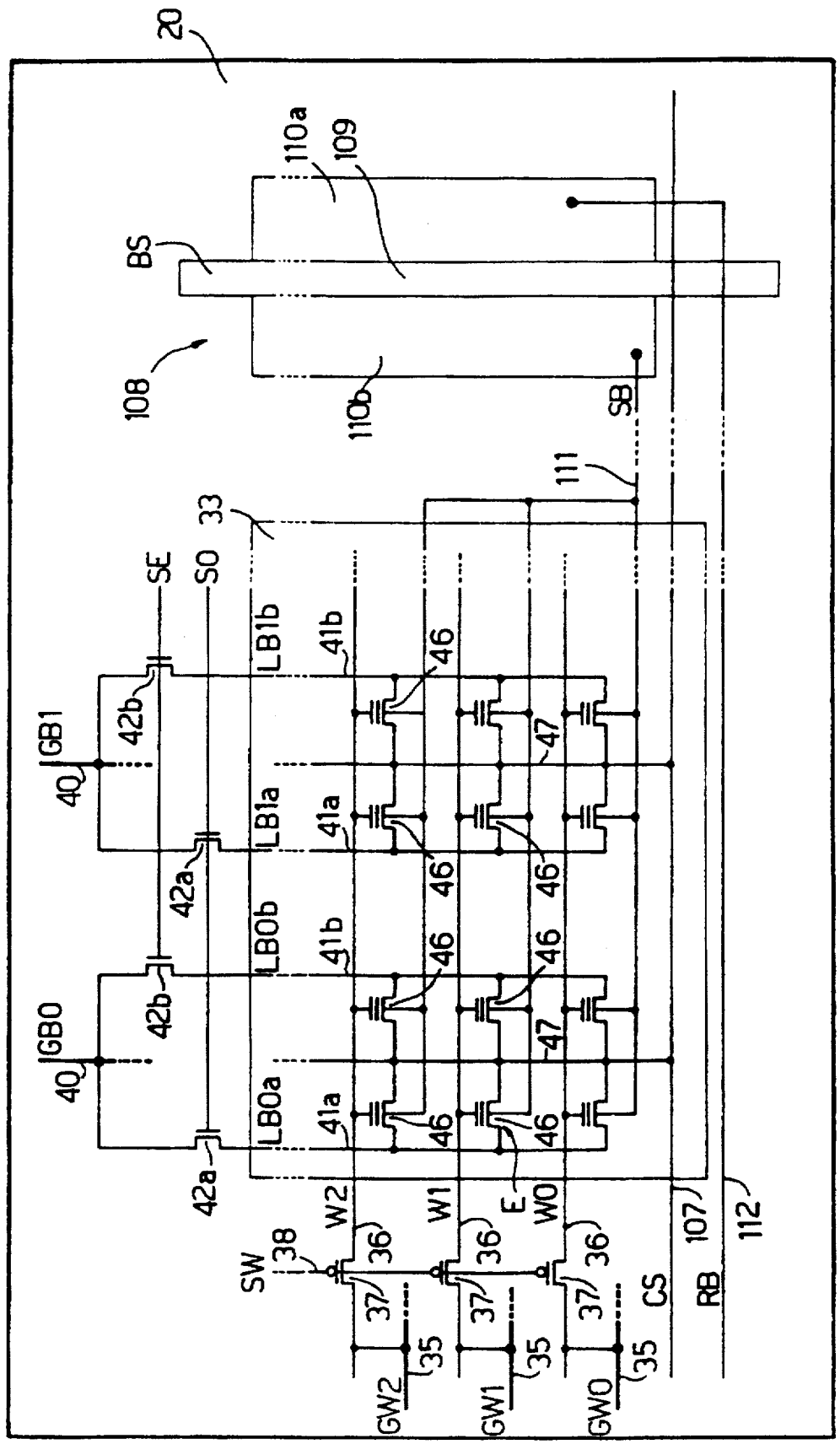
FIGS. 9 to 11 show the schematic diagrams of three variations of the architecture of the memory according to the invention.

FIG. 9 shows a triple well solution with FN erase and write and local bulk decoding, wherein memory array 20 is assumed organized in rows, i.e., all the sectors in the same row are erased simultaneously.

FIG. 9 shows twelve cells 46 arranged in pairs spaced horizontally (in the direction of the word lines), three global word lines 35 at potential GW0–GW2, respective P-channel local word selection transistors 37, three local word lines 36 at potential W0–W2, two global bit lines 40 at potential GB0–GB1, four respective local bit selection transistors 42a and 42b; four respective local bit lines 41a and 41b at potentials LB0a, LB0b, LB1a, LB1b, two source bit lines 47, a common source line 107 at potential CS, and which may coincide with global line 44 in FIG. 4, formed in the first metal level, or be a diffused local line connected to global line 44, and a P-channel bulk selection transistor 108 with a gate terminal 109 and source and drain terminals 110a and 110b. In the above row architecture, transistor 108 is common to all the sectors in the same row.

In FIG. 9, gate terminal 109 of bulk selection transistor 108 is controlled by a signal BS, a first terminal 110a is biased by a line 112 at potential RB, and a second terminal 110b is connected to the bulk of all of cells 46 by a line 111 at potential SB. Bulk biasing and decoding lines 112 and 109 are advantageously connected to a section of source decoder 30.

Bulk selection transistor 108 and local word selection transistors 37 are typically formed in global well 97 like transistors 89 in FIGS. 7 and 8, and line 111 corresponds to line 106 in FIG. 8. Local bit selection transistors 42a and 42b, on the other hand, are formed in well 98, to the side of memory cells 46.

The FIG. 12 Table shows the biasing and control signals relative to the FIG. 9 solution, for reading and writing cell E connected to local word line W1 and to local bit line LBOa, and for flash erasing the whole sector. R indicates read mode, W write mode, and E erase mode. In the FIG. 12 Table, writing is defined as the operation performed byte by byte (in this case, the extraction of negative charges or injection of positive charges in the floating gate region), and erasure as the operation performed on the whole sector (opposite charge movement).

As can be seen, in read and write, signal SW provides for correctly biasing the local word line to which the cell to be read or written is connected, and for grounding, and so preventing stress of, the cells of all the other non-addressed local word lines. In erase, signals RB and BS provide for biasing the P-well 98 in which the sector is formed at a lower voltage than ground (substrate 90, well 97), and so applying to the gate terminals a voltage, measured with respect to ground, which, in absolute value, is lower than the voltage which is necessary when the bulk is grounded (as, for example, in the FIG. 11 case described below).

According to a variation of FIG. 9, local word selection transistors 37 are N-channel types, and are integrated in well 91 of FIG. 7 (like transistor 87), in which case, the FIG. 12 biasing must be modified accordingly.

Figure 10:
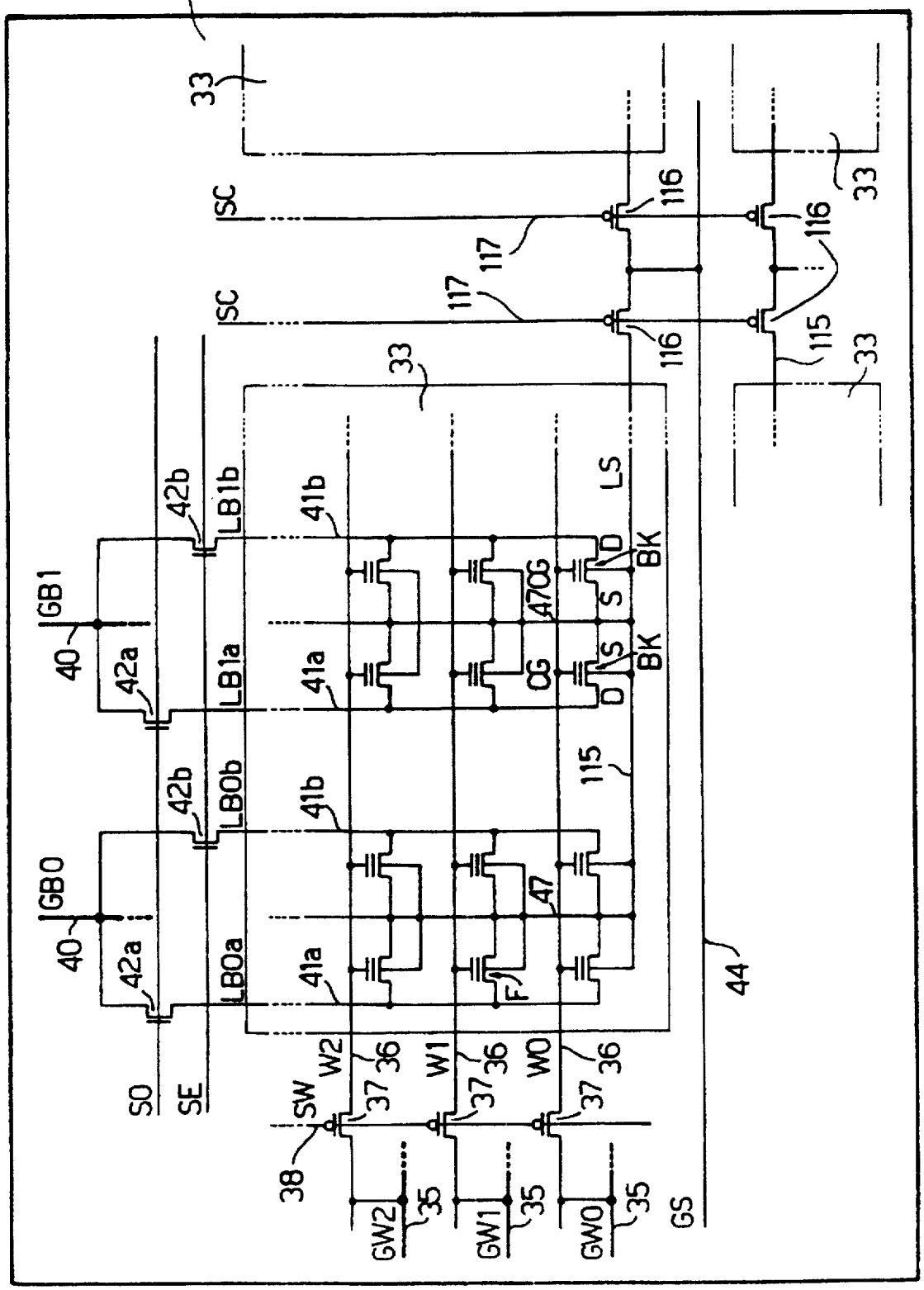

FIG. 10 shows a triple well, FN erase and write solution with common local source and bulk decoding for permitting erasure sector by sector.

In the FIG. 10 solution, the bulk regions BK (formed by well 98 in FIG. 7) of cells 46 are shown all connected together and to respective source regions S. The source and bulk regions are biased by a local source line 115 at potential LS and connected to global source line 44 by a P-channel source selection transistor 116. Each sector comprises its own source selection transistor 116 (FIG. 10 shows two, relative to two adjacent sectors 33). The transistors relative to sectors in the same column are connected to the same source selection line 117 on which a source selection signal SC is supplied, and source selection lines 117 are connected to source decoder 30 in FIG. 2. The rest of the FIG. 10 solution corresponds with the architecture already described with reference to FIG. 4.

Source selection transistors 116 and local row transistors 37 are formed in global N-well 97 in FIG. 7.

The FIG. 13 Table shows the biasing and control signals relative to the FIG. 10 solution, for reading and writing cell F connected to local word line W1 and to local bit line LBOa, and for flash erasing the whole sector. Again, R, W and E respectively indicate read, write and erase, writing is defined as the operation performed byte by byte, and erasure as the operation performed on the whole sector. Unlike the FIG. 9 solution (and FIG. 12 Table), however, in which the source region is maintained grounded, the FIG. 10 solution and FIG. 13 Table provide for equal negative voltage biasing of the source and bulk regions.

As is known, and as in the previous case, in read and write, signal SW provides for correctly biasing the selected row, and keeps the non-selected rows grounded. In erase, signals SE and SO are maintained at a high negative voltage (−8 V) to safely turn off local bit selection transistors 42a and 42b and prevent the high negative voltage (−8 V) of the bulk (P-well 98) from being transmitted to global bit lines 40.

The basic architecture of the above FN write solutions may also be used for single byte CHE writing, in which case, triple well technology may be replaced by the cheaper twin well technology in FIG. 6.

For single byte CHE writing, low write current cells (below 200μ) are assumed. Here, two possible biasing solutions are presented, depending on whether read and write are performed by bringing the same terminal (drain) to a high voltage with respect to the bulk potential of the cell (potential of well 77 in FIG. 6), with a symmetrical cell structure, or whether read and write are performed at different terminals, with an asymmetrical cell structure (i.e., with a particular implant at the drain and source regions of the cells). Numerous solutions are known for forming such an asymmetrical structure, but are not described by virtue of not forming part of the object of the present invention.

Figure 11:
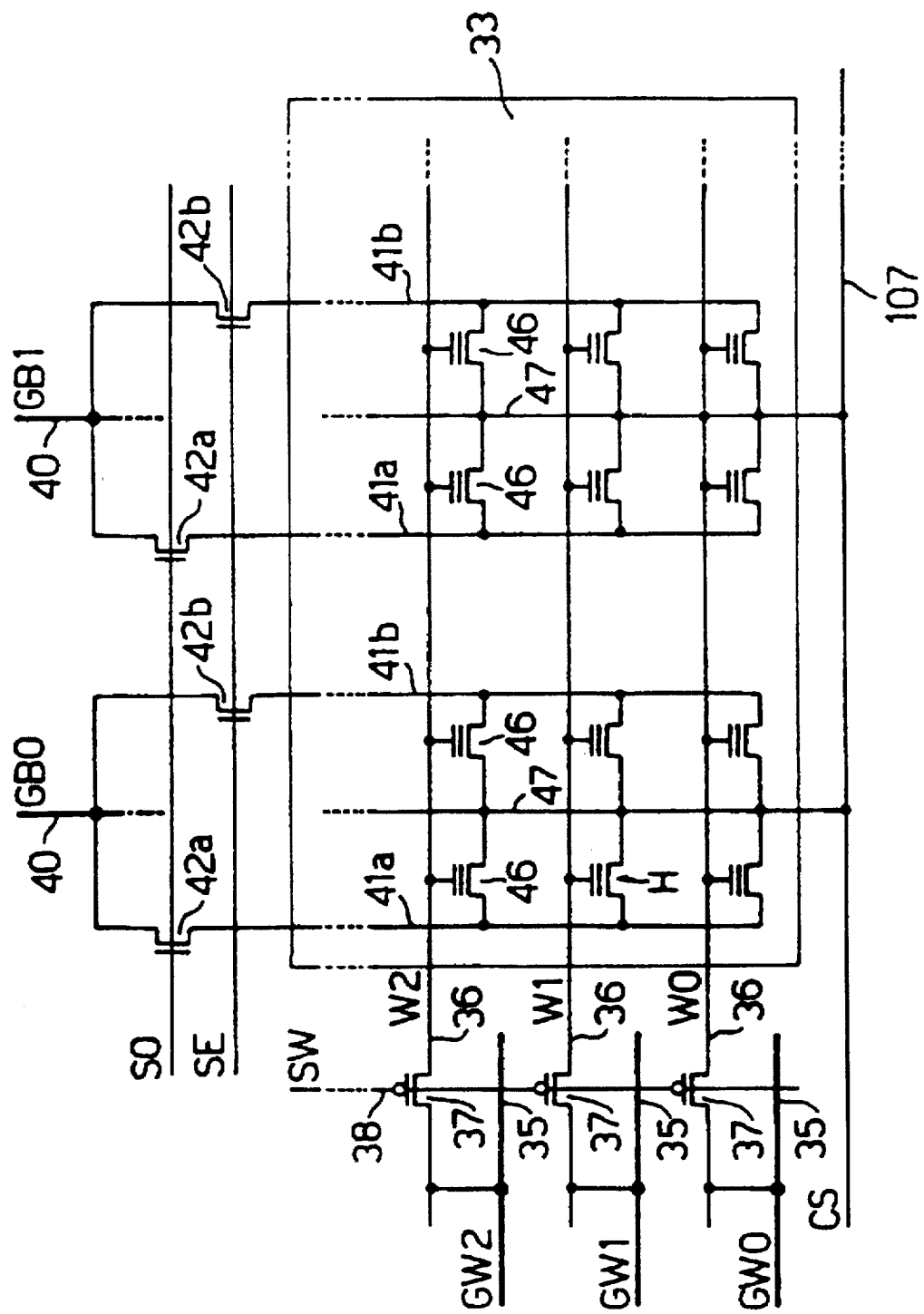

FIG. 11 shows a twin well, CHE write-FN erase solution with common source biasing (simultaneous erasure) for all the sectors in the same row, and read and write at the same terminal (drain) of the cells.

The FIG. 11 solution presents substantially the same organization as in FIG. 9, except for the absence of bulk selection transistor 108.

For the FIG. 11 solution, the FIG. 14 Table applies, which relates to reading and writing of cell G connected to local word line W1 and to local bit line LBOa, and to flash erasure of the whole sector. Again, write and erase are deformed as above.

With the biasing shown, cell G is written by bringing the gate terminal to a high voltage (12 V), the drain terminal to a medium-high voltage (5 V), and by grounding the source terminal. In this case, unlike the biasing in FIGS. 12 and 13, writing involves injecting negative charges into the floating gate region of the cell. Conversely, erasure is performed by bringing the gate terminal to a high negative voltage (−8 V), the drain terminal to a medium-high voltage (5 V), and by grounding the source terminal.

A second solution for implementing the CHE write-FN erase mode is, as stated, to asymmetrically bias the cells in read and write mode, for which a twin well solution with source decoding will now be described. To this end, the FIG. 10 architecture previously described in connection with the FN erase and write, triple well, source decoding solution may be used. Thus, FIG. 10 will also be referred to in the following description of the second CHE/FN solution.

Using twin well technology, bulk selection transistor 108 and local word selection transistors 37 are formed in an N-well 79 (FIG. 6), and local bit selection transistors 42a and 42b are formed in wells 77, to the side of memory cells 46.

The FIG. 15 Table shows the biasing and control signals relative to the above FN/CHE solution, for reading and writing cell E.

With the biasing shown, cell E is read by applying a low voltage (2 V) to the source terminal, and is written by bringing the drain terminal to a medium-high voltage (5 V), i.e., read and write are performed at different terminals. In this case also, writing involves injecting negative charges into the floating gate region of the cell.

The advantages of the architecture described are as follows. In particular, it is extremely flexible by permitting the implementation of widely differing solutions in terms of requirements and cost, including CHE or FN write modes, twin or triple wells, and symmetrical or asymmetrical cells. It also provides for exploiting the advantages typical of contactless cell integration processes, i.e., highly compact size, by virtue of the spacing of the cell pairs only partly impairing the size advantage of such processes. As such, the memory according to the present invention presents high integration density, high performance, and low cost.

Clearly, changes may be made to the memory as described and illustrated herein without, however, departing from the spirit and scope of the present invention. In particular, the FIG. 9–11 solutions and relative biasing schemes are only some of the many possibilities afforded by the present invention, by variously combining different decoding modes and technologies. Similarly, the implementation shown in FIGS. 5a and 5b relative to spacing of the adjacent cell pairs is only one example. By way of alternative, it is also possible to eliminate the floating gate line 57 over the oxide region separating the cell pairs in FIG. 5a.

We claim:

1. An electrically erasable and programmable memory device, comprising:
    a global bit line;
    a global word line;
    a global source line; and
    an array of memory cells, the array having one or more sectors that each include,
        first and second local bit lines,
        first and second bit-line switches that are respectively coupled between said first and second local bit lines and said global bit line,
        first and second local word lines,
        first and second word-line switches that are respectively coupled between said first and second local word lines and said global word line,
        a first one of said memory cells having a drain coupled to said first local bit line, a gate coupled to said first local word line, a source coupled to said global source line, and a bulk region,
        a second one of said memory cells having a drain coupled to said second local bit line, a gate coupled to said first local word line, a source coupled to said global source line, and a bulk region,
        a third one of said memory cells having a drain coupled to said first local bit line, a gate coupled to said second local word line, a source coupled to said global source line, and a bulk region, and
        a fourth one of said memory cells having a drain coupled to said second local bit line, a gate coupled to said second local word line, a source coupled to said global source line, and a bulk region.

2. The memory device of claim 1 wherein said each sector further includes a local source line that is interposed between and coupled to said global source line and said sources of said first, second, third, and fourth memory cells.

3. The memory device of claim 1 wherein said each sector further includes:
    a local source line that is coupled to said sources of said first, second, third, and fourth memory cells; and
    a source-line switch that is interposed between and coupled to said global source line and said local source line.

4. The memory device of claim 1 wherein said each sector further includes a bulk switch interposed between and coupled to a bulk-potential line and said bulk regions of said first, second, third, and fourth memory cells.

5. The memory device of claim 1 wherein said each sector further includes:
    a local source line that is coupled to said sources and said bulk regions of said first, second, third, and fourth memory cells; and
    a source-line switch that is interposed between and coupled to said global source line and said local source line.

6. The memory device of claim 1, further comprising:
    first and second bit selection lines;
    said first bit-line switch having a control terminal that is coupled to said first bit selection line; and
    said second bit-line switch having a control terminal that is coupled to said second bit selection line.

7. A flash-EEPROM memory comprising:
    a memory array formed by a first plurality of memory cells arranged side by side in rows and columns, and each formed by a drain region, a source region, and a gate region;
    a bit line;
    said drain and source regions being formed by first elongated regions forming drain and source lines extending parallel to one another in a semiconductor material body;
    said gate regions being formed by second elongated regions forming word lines extending over said semiconductor material body and insulated from and transverse to said drain and source lines;
    wherein, in a direction parallel to said word lines, said memory cells are grouped into pairs formed by two adjacent memory cells;
    each pair of cells being spaced from adjacent pairs of cells in said direction
    first cells of said respective pairs forming a first column;
    second cells Of said respective pairs forming a second column;
    a first selection element that is operable to couple said drain regions of said first cells to said bit line; and
    a second selection element that is operable to couple said drain regions of said second cells to said bit line, said second selection element being controlled independently of said first selection element.

8. A flash-EEPROM memory as claimed in claim 7 wherein said pairs of memory cells are grouped into sectors, and wherein the pairs of cells within a respective sector are coupled to a respective common source line.

9. The flash-EEPROM memory as claimed in claim 7 wherein said each pair of cells is connected to respective drain and source lines that are physically separated from drain and source lines that are connected to adjacent pairs of cells in said direction.

10. The flash-EEPROM memory as claimed in claim 7 wherein said each pair of cells is connected to two drain lines and one source line.

11. The flash-EEPROM memory as claimed in claim 7 wherein said each pair of cells is separated from adjacent pairs of cells in said direction by nonconducting insulating lines.

12. The flash-EEPROM memory as claimed in claim 11 wherein said nonconducting isolating lines are formed by field oxide regions interposed between first elongated regions forming drain lines that are connected to adjacent pairs of cells in said direction.

13. A flash-EEPROM memory comprising:
a memory array formed by a first plurality of memory cells arranged side by side in rows and columns, and each formed by a drain region, a source region, and a gate region:
said drain and source regions being formed by first elongated regions that form drain and source lines extending parallel to one another in a semiconductor material body;
said gate regions being formed by second elongated regions that form word lines extending over said semiconductor material body and insulated from and transverse to said drain and source lines;
wherein in a direction parallel to said word lines, said memory cells are grouped into pairs formed by two adjacent memory cells;
each pair of cells being spaced from adjacent pairs of cells in said direction; and
said each pair of cells being respectively connected to two drain lines and one source line, said drain lines respectively forming two local bit lines that are connected to a single global bit line.

14. The flash-EEPROM memory as claimed in claim 7 wherein said respective drain and source lines are physically separated from other drain and source lines that are connected to adjacent pairs of cells in said direction.

15. The flash-EEPROM memory as claimed in claim 13, wherein said each pair of cells is separated from adjacent pairs of cells in said direction by nonconducting insulating lines.

16. The flash-EEPROM memory as claimed in claim 15, wherein said nonconducting insulating lines are formed by field oxide regions interposed between first elongated regions forming drain lines connected to adjacent pairs of cells in said direction.

17. The flash-EEPROM memory as claimed in claim 13, wherein said memory array is divided into a plurality of sectors arranged in rows and columns, and each sector comprising a second plurality of memory cells presenting a terminal connected to a common bias line; said memory array other comprising additional global bit lines, each extending along a whole column of cells in said memory array; and additional local bit lines, each extending along a respective sector; each said local bit line being connected to a respective global bit line by a respective local bit selection element presenting a control terminal.

18. A flash-EEPROM memory comprising:
a memory array formed by a first plurality of memory cells arranged side by side in rows and columns, and each formed by a drain region, a source region, and a gate region;
said drain and source regions being formed by first elongated regions that form drain and source lines extending parallel to one another in a semiconductor material body;
said gate regions being formed by second elongated regions that form word lines extending over said semiconductor material body and insulated from and transverse to said drain and source lines;
wherein, in a direction parallel to said word lines, said memory cells are grouped into pairs formed by two adjacent memory cells:
each pair of cells being spaced from adjacent pairs of cells in said direction;
said memory array being divided into a plurality of sectors arranged in rows and columns, and each sector comprising a second plurality of memory cells presenting a terminal connected to a common bias line;
the memory array further including global bit lines, each extending along a whole column of cells in said memory array;
local bit lines each extending along a respective sector and each being connected to a respective global bit line by a respective local bit selection element presenting a control terminal;
wherein for each sector, each global bit line is connected to a first and second local bit line by a first and second local bit selection element respectively; and
the control terminals of the first and second local bit selection elements relative to sectors in the same row of sectors being connected respectively to a first and a second local bit selection line.

19. The flash-EEPROM memory as claimed in claim 18, further comprising at least a local column decoding unit that is connected to said first and second local bit selection lines.

20. A flash-EEPROM memory comprising:
a memory array formed by a first plurality of memory cells arranged side by side in rows and columns, and each formed by a drain region, a source region, and a gate region;
said drain and source regions being formed by first elongated regions that form drain and source lines extending parallel to one another in a semiconductor material body;
said gate regions being formed by second elongated regions that form word lines extending over said semiconductor material body and insulated from and transverse to said drain and source lines;
wherein, in a direction parallel to said word lines, said memory cells are grouped into pairs formed by two adjacent memory cells;
each pair of cells being spaced from adjacent pairs of cells in said direction;
said memory array being divided into a plurality of sectors arranged in rows and columns, and each sector comprising a second plurality of memory cells presenting a terminal connected to a common bias line;
the memory array further including global bit lines, each extending along a whole column of cells in said memory array;
local bit lines each extending along a respective sector and each being connected to a respective global bit line by a respective local bit selection element presenting a control terminal;
global word lines, each extending along a whole row of cells of said memory array; and
local word lines, each extending along a respective sector, each said local word line being connected to a respective global word line by a respective local word selection element presenting a control terminal.

21. The flash-EEPROM memory as claimed in claim 20, further comprising:
at least a local row decoding unit that is connected to local word selection lines; and
the control terminals of the local word selection elements relative to sectors in the same column of sectors being connected to the same said local word selection line.

22. A flash-EEPROM memory comprising:
a memory array formed by a first plurality of memory cells arranged side by side in rows and columns, and each formed by a drain region, a source region, and a gate region;

said drain and source regions being formed by first elongated regions that form drain and source lines extending parallel to one another in a semiconductor material body;

said gate regions being formed by second elongated regions that form word lines extending over said semiconductor material body and insulated from and transverse to said drain and source lines;

wherein, in a direction parallel to said word lines, said memory cells are grouped into pairs formed by two adjacent memory cells;

each pair of cells being spaced from adjacent pairs of cells in said direction;

said memory array being divided into a plurality of sectors arranged in rows and columns, and each sector comprising a second plurality of memory cells presenting a terminal connected to a common bias line;

the memory array further including global bit lines, each extending along a whole column of cells in said memory array;

local bit lines each extending along a respective sector and each being connected to a respective global bit line by a respective local bit selection element presenting a control terminal;

wherein said common terminal is a source terminal;

global source lines, each extending along a whole row of sectors of said memory array; and local source lines, each extending along a respective sector each said local source line being connected to a respective global source line by a respective source selection element presenting a control terminal.

23. The flash-EEPROM memory as claimed in claim 22, further comprising:

a source decoding unit connected to source selection lines; and the control terminals of the source selection elements relative to sectors in the same column of sectors being connected to the same said source selection line.

24. A flash-EEPROM memory comprising:

a memory array formed by a first plurality of memory cells arranged side by side in rows and columns, and each formed by a drain region, a source region, and a gate region;

said drain and source regions being formed by first elongated regions that form drain and source lines extending parallel to one another in a semiconductor material body;

said gate regions being formed by second elongated regions that form word lines extending over said semiconductor material body and insulated from and transverse to said drain and source lines;

wherein, in a direction parallel to said word lines, said memory cells are grouped into pairs formed by two adjacent memory cells;

each pair of cells being spaced from adjacent pairs of cells in said direction;

said memory array being divided into a plurality of sectors arranged in rows and columns, and each sector comprising a second plurality of memory cells presenting a terminal connected to a common bias line;

the memory array further including global bit lines, each extending along a whole column of cells in said memory array; and local bit lines each extending along a respective sector and each being connected to a respective global bit line by a respective local bit selection element presenting a control terminal;

circuit transistors of a first and second channel type;

a substrate of a first conductivity type and a first doping level, at least a first well in said substrate, the first well of a second conductivity type, and second wells in said substrate, the second wells of said first conductivity type and of a second doping level; and said circuit transistors of said first channel type being formed in said first well, and said memory cells and said circuit transistors of said second channel type being formed in said second wells.

25. The flash-EEPROM memory as claimed in claim 24, further comprising global source lines, each extending along a whole row of sectors and connected directly to said source lines.

26. The flash-EEPROM memory as claimed in claim 24, further comprising:

a plurality of source selection transistors, one for each sector, each said source selection transistor presenting a terminal connected directly to said source lines of a respective sector and to some of said second wells, a second terminal connected to a global source line, and a control terminal connected to a source decoding unit, said source selection transistors being formed in said first well.

27. A flash-EEPROM memory comprising:

a memory array formed by a first plurality of memory cells arranged side by side in rows and columns, and each formed by a drain region, a source region, and a gate region;

said drain and source regions being formed by first elongated regions that form drain and source lines extending parallel to one another in a semiconductor material body;

said gate regions being formed by second elongated regions that form word lines extending over said semiconductor material body and insulated from and transverse to said drain and source lines; wherein, in a direction parallel to said word lines, said memory cells are grouped into pairs formed by two adjacent memory cells;

each pair of cells being spaced from adjacent pairs of cells in said direction;

said memory array being divided into a plurality of sectors arranged in rows and columns, and each sector comprising a second plurality of memory cells presenting a terminal connected to a common bias line;

the memory array further including global bit lines, each extending along a whole column of cells in said memory array; and local bit lines each extending along a respective sector and each being connected to a respective global bit line by a respective local bit selection element presenting a control terminal;

circuit transistors of a first and second channel type;

a substrate of a first conductivity type and of a first doping level, at least a first well in said substrate, the first well of a second conductivity type, at least a second well in said substrate, the second well of said first conductivity type and of a second doping level, and third wells in said first well, the third wells of said first conductivity type;

said memory cells being formed in said third wells;

said circuit transistors of said first channel type being formed in said first well;

some of said circuit transistors of said second channel type being formed in said second well; and others of said circuit transistors of said second channel type being formed in said third wells.

28. The flash-EEPROM memory as claimed in claim 27, further comprising:

bulk selection transistors presenting a first terminal connected to a bulk bias line, a second terminal connected to a connecting line extending along a whole row of sectors and connected to said third wells, and a control terminal connected to a source decoding unit, said bulk selection transistors being formed in said first well; and common source lines, each extending along a whole row of sectors and being connected directly to said source lines of said sectors in said row of sectors.

29. The flash-EEPROM memory as claimed in claim 27, further comprising:

a plurality of source selection transistors, one for each sector, each said source selection transistor presenting a terminal connected directly to said source lines of a respective sector and to one of said third wells, a second terminal connected to a global source line, and a control terminal; and said source selection transistors being formed in said first well.

30. An electrically erasable and programmable memory device, comprising:

a global bit line;

a global word line;

a global source line; and an array of memory cells, the array having one or more sectors that each include, first and second local bit lines, first and second bit-line switches that are respectively coupled between said first and second local bit lines and said global bit line, a local word line;

a word-line switch that is coupled between said local word line and said global word line, a first one of said memory cells having a drain coupled to said first local bit line, a gate coupled to said local word line, and a source coupled to said global source line, and a second one of said memory cells having a drain coupled to said second local bit line, a gate coupled to said local word line, and a source coupled to said global source line.

31. The memory device of claim 30 wherein said each sector further includes a local source line that is interposed between and coupled to said global source line and said sources of said first and second memory cells.

32. The memory device of claim 30 wherein said each sector further includes:

a local source line that is coupled to said sources of said first and second memory cells; and a source-line switch that is interposed between and coupled to said global source line and said local source line.

33. The memory device of claim 30 wherein:

said first and second memory cells each include a respective bulk region; and said each sector further includes a bulk switch interposed between and coupled to a bulk-potential line and said bulk regions of said first and second memory cells.

34. The memory device of claim 30 wherein:

said first and second memory cells each have a respective bulk region; and said each sector further includes, a local source line that is coupled to said sources and said bulk regions of said first and second memory cells, and a source-line switch that is interposed between and coupled to said global source line and said local source line.

35. The memory device of claim 30, further comprising:

first and second bit selection lines;

the first bit-line switch having a control terminal that is coupled to the first bit selection line; and the second bit-line switch having a control terminal that is coupled to the second bit selection line.

36. An electrically erasable and programmable memory device, comprising:

first and second global bit lines;

a word line;

a global source line; and an array of memory cells, the array having one or more sectors that each include, first and second local bit lines, first and second bit selection lines, a first bit-line switch that is coupled between the first global bit line and the first local bit line, the first bit-line switch having a control terminal that is coupled to the first bit selection line, a second bit-line switch that is coupled between the second global bit line and the second local bit line, the second bit-line switch having a control terminal that is coupled to the second bit selection line, a first one of the memory cells having a first source/drain region coupled to the first local bit line, a gate coupled to the word line, and a second source/drain region coupled to the global source line, and a second one of the memory cells having a first source/drain region coupled to the second local bit line, a gate coupled to the word line, and a second source/drain region coupled to the global source line.

37. The memory device of claim 36 wherein each sector further includes:

a local source line that is coupled to the second source/drain regions of the first and second memory cells;

a source selection line; and a source-line switch that is interposed between and coupled to the global source line and the local source line, the source-fine switch having a control terminal that is coupled to the source selection line.

38. An electrically erasable and programmable memory device, comprising:

a global bit line;

a word line;

a global source line; and an array of memory cells, the array having one or more sectors that each include, first and second local bit lines, first and second bit selection lines, a first bit-line switch that is coupled between the global bit line and the first local bit line, the first bit-line switch having a control terminal that is coupled to the first bit selection line, a second bit-line switch that is coupled between the global bit line and the second local bit line, the second bit-line switch having a control terminal that is coupled to the second bit selection line, a first one of the memory cells having a first source/drain region coupled to the first local bit line, a gate coupled to the word line, and a second source/drain region coupled to the global source line, and a second one of the memory cells having a first source/drain region coupled to the second local bit line, a gate coupled to the word line, and a second source/drain region coupled to the global source line.

39. The memory device of claim 38 wherein each sector further includes:

a local source line that is coupled to the second source/drain regions of the first and second memory cells;

a source selection line; and a source-line switch that is interposed between and coupled to the global source line and the local source line, the source-line switch having a control terminal that is coupled to the source selection line.

* * * * *

UNITED STATES PATENT AND TRADEMARK OFFICE
CERTIFICATE OF CORRECTION

PATENT NO. : 5,717,636
DATED : February 10, 1998
INVENTOR(S) : Marco Dallabora, et al.

It is certified that error appears in the above-identified patent and that said Letters Patent is hereby corrected as shown below:

In column 12, claim 7, line 36, following the word "direction", please insert --;--.

In column 13, claim 15, line 27, following the number "13", please delete ",".

In column 13, claim 16, line 31, following the number "15", please delete ",".

In column 13, claim 17, line 36, following the number "13", please delete ",".

In column 13, claim 17, line 41, please delete the word "other", and insert therefore --further--.

In column 15, claim 22, line 30, following the word "sector", please insert --,--.

Signed and Sealed this

Thirteenth Day of October 1998

*Attest:*

BRUCE LEHMAN

*Attesting Officer*  *Commissioner of Patents and Trademarks*